United States Patent [19]

Lijoi et al.

[11] 4,366,526
[45] Dec. 28, 1982

[54] HEAT-PIPE COOLED ELECTRONIC CIRCUIT CARD

[75] Inventors: Bruno Lijoi, Farmingdale; Vincent Cirrito, Massapequa Park; Fred Edelstein, Hauppauge, all of N.Y.

[73] Assignee: Grumman Aerospace Corporation, Bethpage, N.Y.

[21] Appl. No.: 193,425

[22] Filed: Oct. 3, 1980

[51] Int. Cl.³ .............................................. H05K 7/20
[52] U.S. Cl. .................................. 361/385; 361/415; 174/15 HP
[58] Field of Search ............... 361/381, 382, 385, 386, 361/392, 394, 415; 174/15 HP; 357/82; 165/80 C, 80 E, 104.33

[56] References Cited

U.S. PATENT DOCUMENTS

| | | | |
|---|---|---|---|
| 3,143,592 | 8/1964 | August | 361/385 |
| 3,651,865 | 3/1972 | Feldmanis | 361/385 |
| 4,118,756 | 10/1978 | Nelson | 361/385 |

FOREIGN PATENT DOCUMENTS

| | | | |
|---|---|---|---|
| 731623 | 4/1980 | Bulgaria | 361/385 |

Primary Examiner—Gerald P. Tolin
Attorney, Agent, or Firm—Richard G. Geib

[57] ABSTRACT

A circuit card having the capability for the high-density packaging of electronic components thereon for use in high power-density card racks in computer and other electronic and avionic systems. The card has an all metal construction with an elongated planar body portion for the mounting of electronic components on the opposite sides thereof and has a heat pipe located along the edges of one elongated side and the two ends. A connector for making the required electrical connections to the electronic components is provided along the edge of the second elongated side. Edge tabs on the ends of the card permit the card to be installed into a card rack in electronic equipment. The elongated portion of the heat pipe serves as the evaporator region thereof and the two end portions act as the condensing regions. In operation, heat from the components on the card is conducted into the evaporator region of the heat pipe and is transferred to the condensing region thereof where it passes by conduction into the cooling system of the card rack.

1 Claim, 8 Drawing Figures

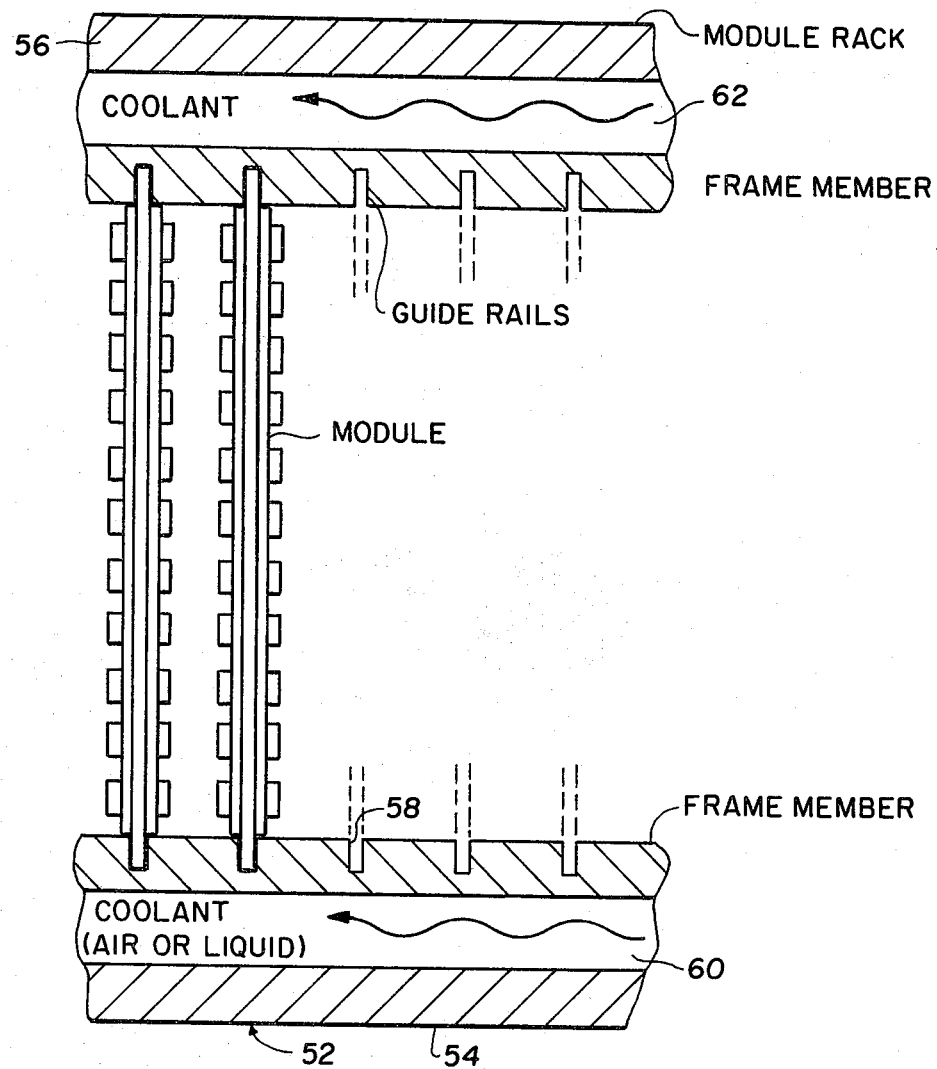
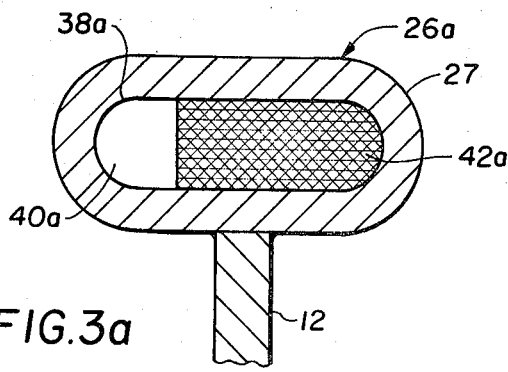
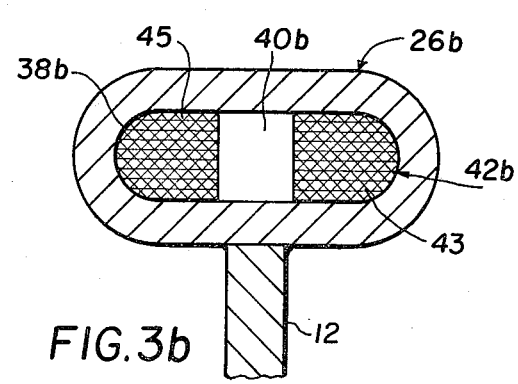

FIG.5
MAXIMUM PART TEMPERATURES VS. POWER
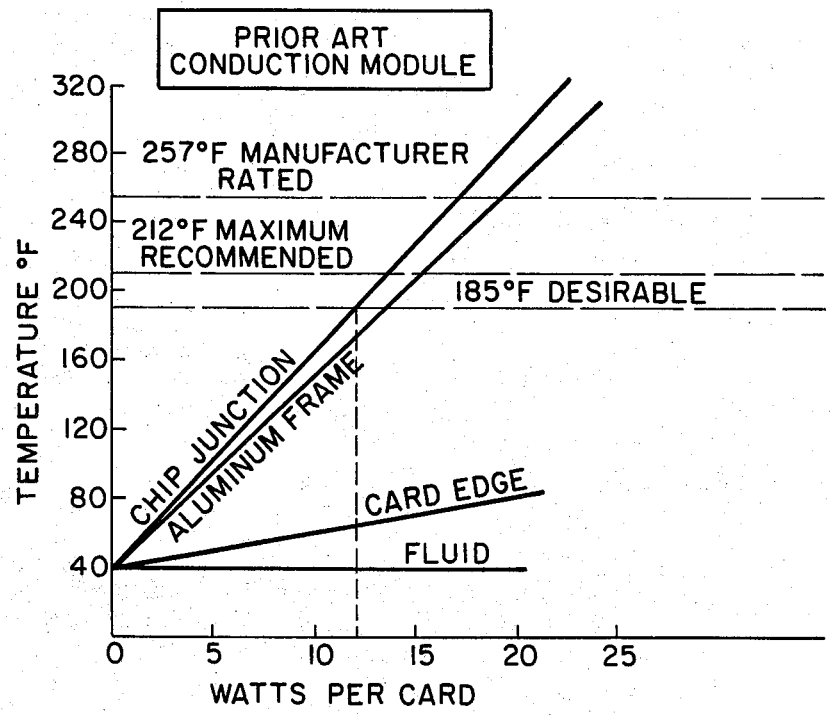
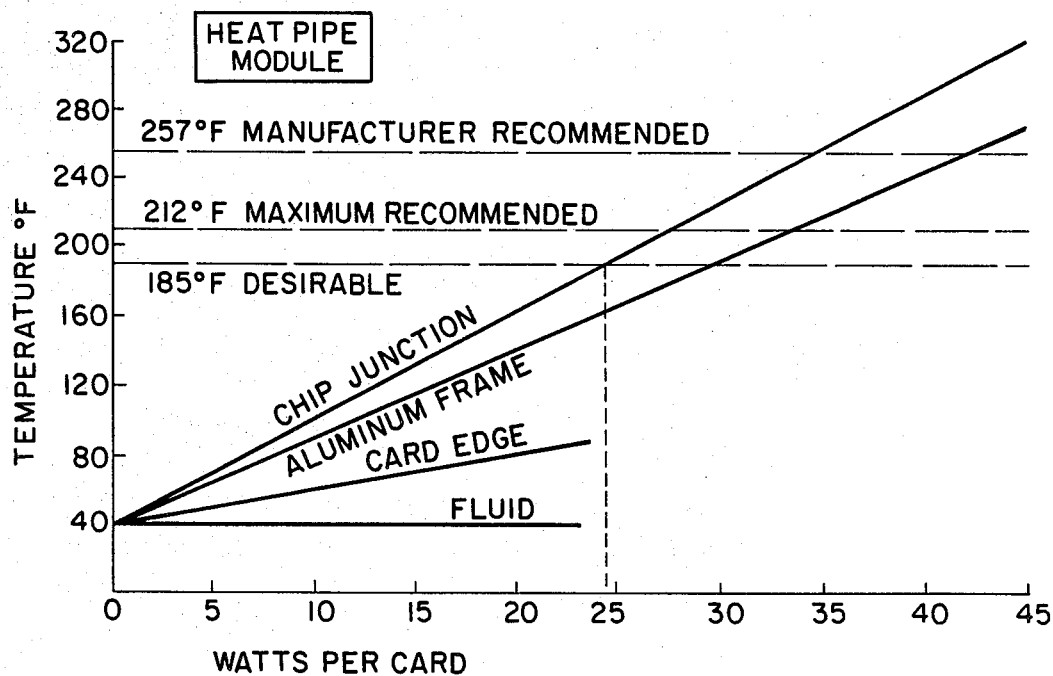

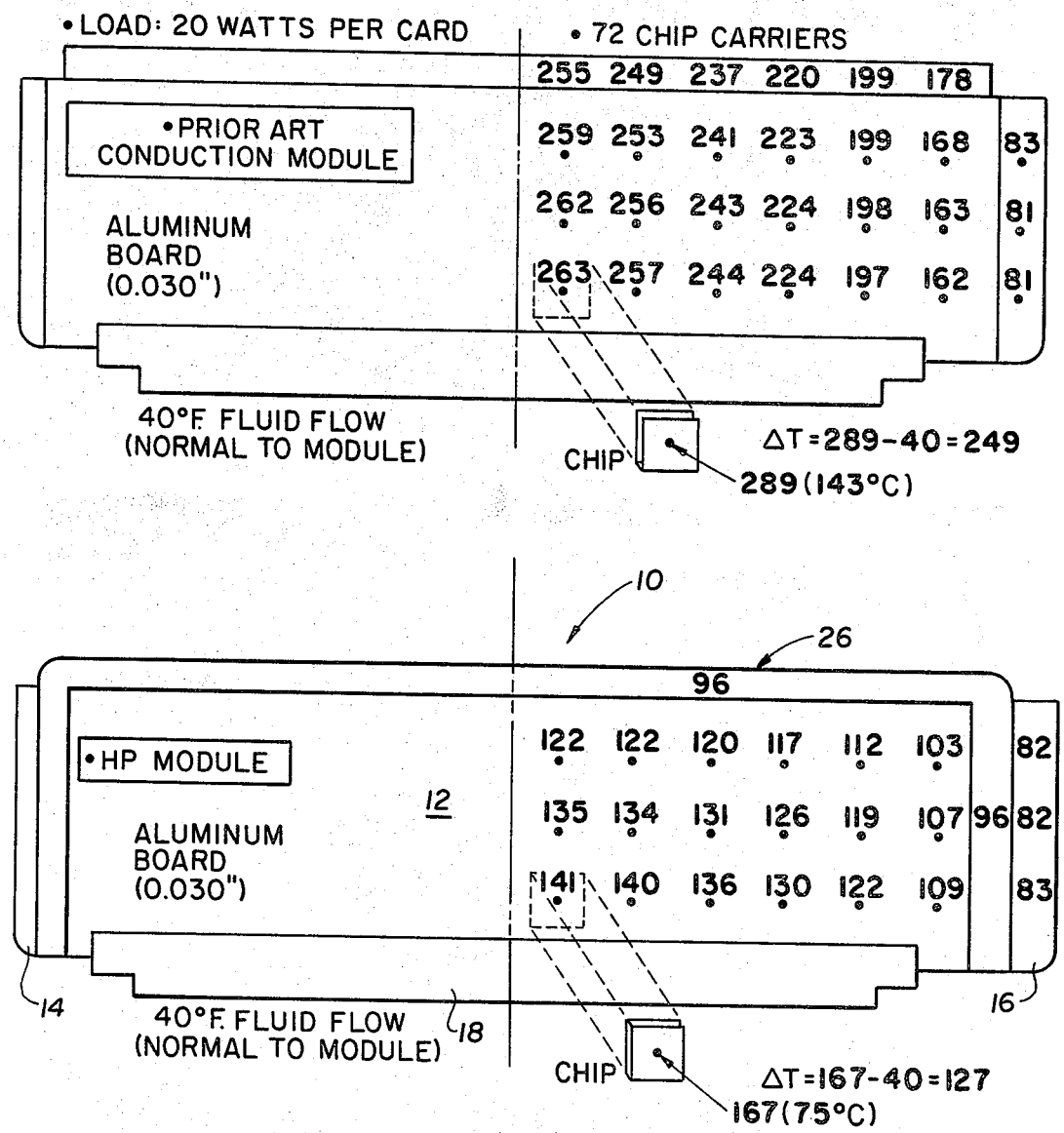

HEAT-PIPE COOLED ELECTRONIC CIRCUIT CARD

BACKGROUND OF THE INVENTION

1. Field of the Invention

This invention relates to electronic circuit boards or cards and, more particularly, to electronic circuit cards in which heat pipe technology is used to dissipate heat therefrom.

2. Background of the Invention

In many electronic systems, particularly those carried in vehicles such as aircraft where high-density packaging prevails because of space limitations, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical approach to cooling components in electronic systems in which devices containing integrated circuits are placed on circuit cards is to direct a stream of cooling air across the modules and/or cards. One of the principal disadvantages of this approach is that the air quality (moisture content, contamination, etc.) must be tightly controlled to inhibit corrosion, loss of cooling effectiveness, etc. This feature is necessary in the design of aircraft avionics in particular to assure system reliability. Cooling of components by this means necessitates a number of compromises to the overall system. These compromises include: high pressure drop; uniformity of component form factors; placing the components containing the integrated circuits further apart on the circuit cards; increasing the distance between circuit cards; and increasing the volume and velocity of cooling air directed over the components, which increase requires special considerations in the design of the housings containing the circuit cards and in the mechanical systems for delivering the cooling air.

Increases in the sophistication of electronic systems has brought about denser packaging of electonic components with attendant increases in power density and total card power. This has brought about the evolution of another technique which is a further conventional approach to cooling of card-mounted electronic components. This technique is to use solid metal thermal mounting cards or plates which conduct the heat dissipated by electronic components to a heat sink (cold plate) disposed at the edge of each card. Such an approach, however, results in a large thermal resistance from the component mounting surface to the heat sink, which causes high component temperatures. In an effort to mitigate this problem with metal cards, the prior art has turned to heat pipe technology, a technology with which the subject invention is concerned.

3. Description of the Prior Art

The subject invention is a solid metal circuit card having a heat pipe on edges thereof for dissipating heat by electronic components thereon to a heat sink. Heat pipes per se are, of course, well known, as are solid metal circuit cards or boards for mounting electronic components. In the prior art also there are teachings of metal circuit cards incorporating therein heat pipes for dissipating the heat generated in operation by electronic components mounted on the cards. Constructions of this type are disclosed by K. T. Feldman, Jr., in U.S. Pat. No. 3,613,778; C. J. Feldmanis in U.S. Pat. No. 3,651,865; R. G. McCready in U.S. Pat. No. 4,019,098; and L. A. Nelson et al. in U.S. Pat. No. 4,118,756.

In these prior art designs, it is an object to mount the electronic components directly over heat pipes incorporated in the body of the circuit card or board itself. Because of the danger of puncturing the heat pipe, it thus is not feasible to drill holes in the mounting surface of the board for the mounting of components thereon. For this reason it is thus necessary in most of these designs to bond or weld the electronic components to the surface of the board. As it is not feasible to drill holes in the metal card to mount components by the conventional wire wrap method, this inexpensive, rapid, efficient technique, therefore, is not readily available for use with the prior art heat-pipe cooled circuit cards. McCready in the prior art teaches an alternate component mounting method on a heat-pipe cooled circuit card. In McCready, the terminal pins of the circuit are fixed in the circuit card with the ends thereof projecting normal to the mounting surface and the connector pins of the component are bonded to the terminal pins with the tension of the connection so made holding the component against the surface of the circuit board in what is hoped to be a good heat transfer relationship.

It will be appreciated that the incorporation of heat pipes in the body of the circuit card thus makes it difficult to utilize effective, inexpensive conventional component mounting techniques and also the circuit designer is inhibited in the placement of components on the card. It is also seen that the interchangeability of these prior art circuit cards with pure conduction and air-over-component integrated rack designs is degraded by the alteration of the circuit card form and fit factor due to the incorporation of heat pipes in the body of these prior art circuit cards.

SUMMARY OF THE INVENTION

This invention is a circuit card capable of high-density packaging of electronic components and is particularly designed for use in high-power-density card racks in computers and other electronic and avionic systems. A solid metal is used for the card upon which the components are mounted and a heat pipe is incorporated in the edge of the card. Heat generated from components mounted on the card is passed by conduction through the metal card to the heat pipe which transfers the heat to a heat sink provided in the card rack mounting the card. In a preferred embodiment, the card is configured and dimensioned to be interchangeable with circuit cards such as the Improved Standard Electronic Module-2A (ISEM-2A) utilized by the U.S. Military.

Accordingly, a principal object of the invention is to provide means for mounting electronic components, which means are efficiently cooled to permit the high-density packaging of components.

It is a further object of the invention to apply the concept of a heat pipe used in conjunction with conductive heat transfer through the body of the card to the cooling of electronic components in a circuit card environment.

It is an additional object of the invention to provide a means for increasing the rate of heat transfer from card-mounted electronic components with a passive system having a minimum of moving parts.

Yet another object of the invention to provide a metallic circuit card incorporating a heat pipe to dissipate heat therefrom, which card is interchangeable with standard conduction-cooled cards in card racks used in electronic systems.

A still further object of the invention to provide a circuit card having a heat pipe in which circuit card the heat pipe and weld area is kept to a minimum such that the heat pipe is not susceptible to leakage failure, and in which card the attachment of electronic components is not near the heat pipe itself to thereby minimize the vulnerability to human error when components are being mounted on the card. A yet further object of the invention is to provide a circuit card having a heat pipe in which there is no impingement of the heat pipe into the component mounting area of the card such that the circuit designer is free to mount the components to suite the requirements and is not constrained to mount components in specific discrete locations because of heat pipes or heat exchange passages in the circuit card.

Another object of the invention is to provide a heat pipe cooled circuit card whose design permits component mounting on both sides of the module and in which it is feasible to drill holes where needed through the card such that it is possible to mount components on the board using cost-effective conventional mounting methods such as wire wrap techniques.

DESCRIPTION OF THE DRAWINGS

For the purpose of illustrating the invention, there is shown in the drawings the form which is presently preferred; however, it should be understood that the invention is not necessarily limited to the precise arrangement here shown.

FIG. 3a is a fragmentary cross-sectional view of the heat pipe of a further embodiment of the circuit card of the invention;

FIG. 3b is a fragmentary cross-sectional view of the heat pipe of a yet further embodiment of the circuit card of the invention;

FIG. 4 is a side elevational view of a plurality of conventional circuit cards in a rack or cabinet associated with an electronic system;

FIG. 5 are plots of maximum part temperatures as a function of power comparing a conventional standard conduction-cooled circuit card with the heat-pipe cooled circuit card of the invention; and FIG. 6 are diagrammatic representations of a conventional standard conduction-cooled circuit card and of a heat-pipe cooled circuit card of the invention showing the temperature distribution thereof in operation.

DESCRIPTION OF THE PREFERRED EMBODIMENT

Figure 1:
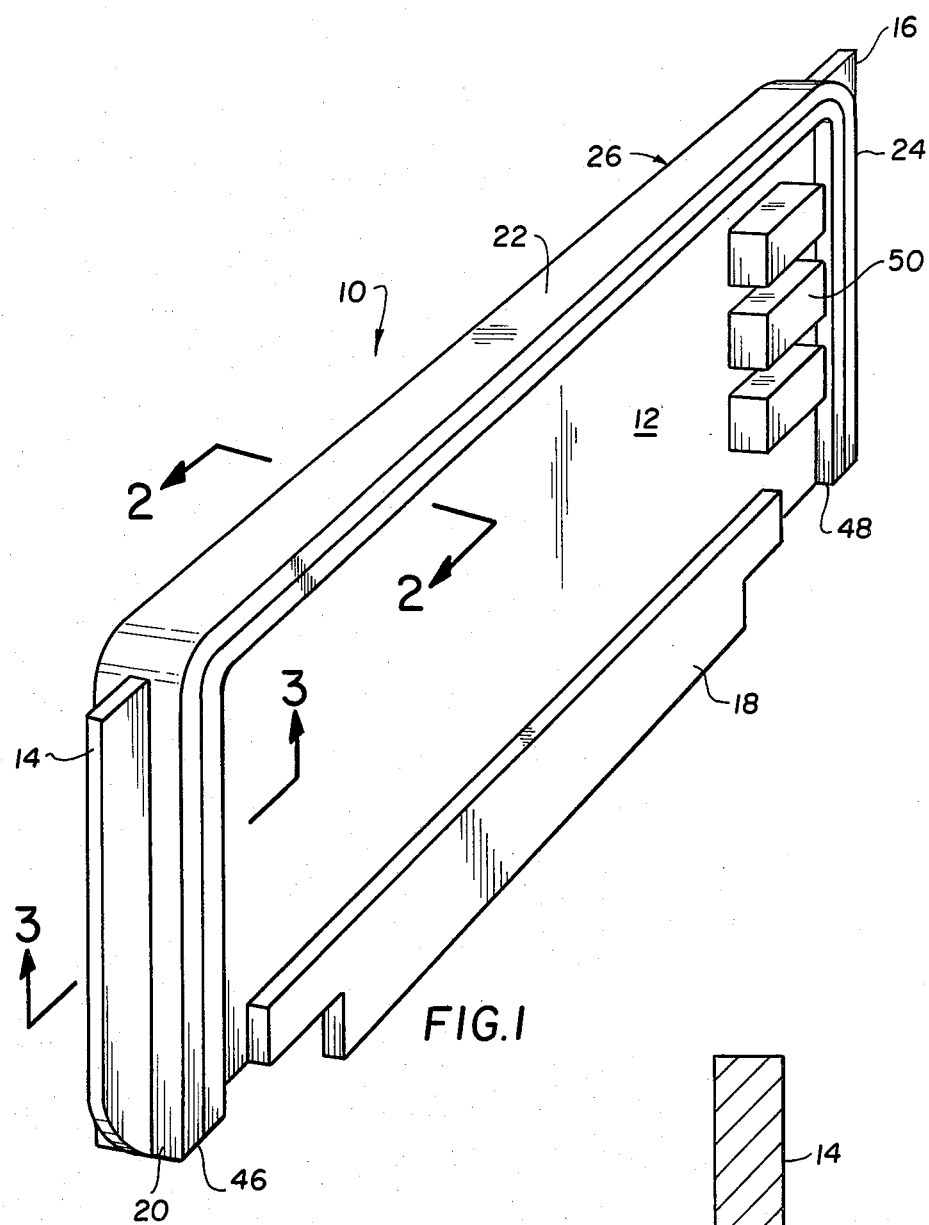
FIG. 1 is a perspective view of the circuit card of the invention.
Figure 2:
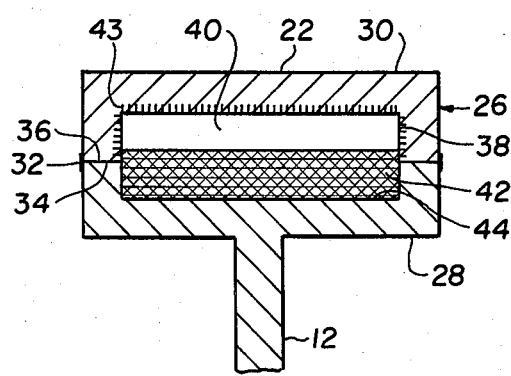
FIG. 2 is a fragmentary cross-sectional view of the circuit card of FIG. 1 taken along line 2—2
Figure 3:
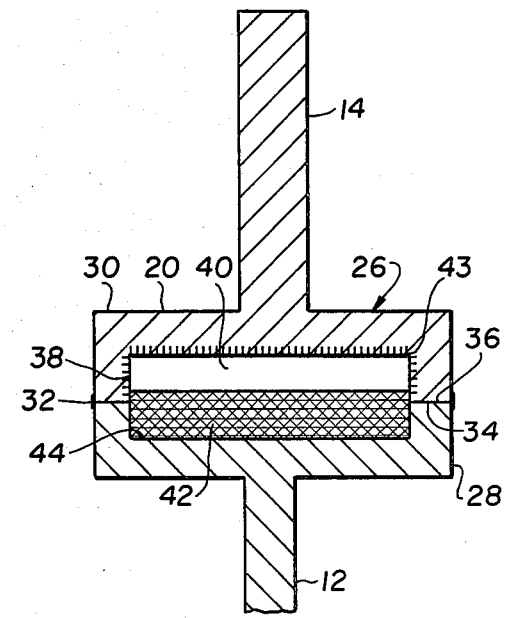
FIG. 3 is a fragmentary cross-sectional view of the circuit card of FIG. 1 taken along line 3—3.

Having now more particular reference to the drawings, FIGS. 1-3 show a preferred embodiment of the circuit card 10 of the invention. Circuit card 10 is a metallic module having a planar component mounting body 12, projecting edge tabs 14 and 16, and a connector strip 18. Preferably the card is fabricated out of aluminum having a thickness at the body of 0.030 in and is configured and dimensioned to be interchangeable with the U.S. Military ISEM-2A Module. Extending around the three sides 20, 22, and 24 of the card is a heat pipe 26 which also is fabricated out of aluminum. As indicated in the cross-sectional views of FIGS. 2 and 3, the heat pipe 26 is formed out of a lower channel member 28 capped by an upper channel member 30. The channels are bonded 32 as by brazing or welding along their faying surfaces 34 and 36 to form a hermetically sealed elongated U-shaped chamber 38 for the heat pipe having a vapor space 40. A wick 42 is secured as by spot welds or other known suitable means to the floor 44 of the chamber adjacent the card body, the wick extending from one sealed end 46 of the heat pipe to the other sealed end 48. Wick 42, as is well known in the art, can be made from fine woven stainless steel wire screening or other similar wick material or it can be fabricated from a relatively porous sintered metal. As is also well known, capillary grooves 43 can be incised into the walls of the chamber 38 to supplement the capacity of the wick 42. In this construction, when the circuit card of this invention is used in a rack having conduction cooling, the section of the heat pipe on side 22 of the circuit card serves as the evaporator section and the sections on card ends 20 and 24 act as the condenser section of the heat pipe. Card ends 20 and 24 can also act as evaporators and condensors simultaneously.

Although a preferred method of fabricating the heat pipe is given above, it will be appreciated that alternate methods of construction are also suitable. For example, the heat pipe can be formed in one piece out of an aluminum extrusion. In addition, alternate wick designs such as those illustrated in FIGS. 3a and 3b can be used. As shown in FIG. 3a, the heat pipe 26a has an extruded one-piece envelope 27 having therein a longitudinal chamber 38a extending the length thereof. A longitudinal wick 42a occupies over one half the width of the chamber 38a and the remaining volume thereof forms a longitudinal vapor space 40a. In the embodiment of FIG. 3b, the wick 42b is divided longitudinally into spaced-apart halves 43 and 45 occupying chamber 38b and a vapor space 40b is provided between the wick halves.

After the heat pipe has been fabricated in the manufacture of the circuit card, the chamber 38 is evacuated of air and a suitable substance is added by conventional means (not shown) to saturate the wick 42. The substance used can be any suitable liquid or material commonly used in heat pipes. Following this step, the heat pipe filling means are sealed and the circuit card is ready for use.

Electronic components can be mounted on both sides of the body 12 of the circuit card. To avoid burdening the drawing with what is believed to be unnecessary detail, only three integrated circuit devices 50 are shown mounted on the card body. It will be understood, of course, that a full range and number of electronic components such as chip carriers, Dual Inline Packages (DIP'S), flatpacks, and the like carried on conventional circuit cards can be mounted on the card of this invention. Mounting can be by any suitable method and holes can be drilled in the body where needed to mount components using conventional wire wrap techniques.

In its preferred embodiment, the circuit card of this invention is used interchangeably with conventional ISEM-2A Modules. As indicated in FIG. 4, ISEM-2A Modules are conventionally mounted in a rack 52 in the equipment. These racks 52 are cabinet-like structures having frame members 54 and 56 provided with slots or guide rails 58 for the reception of the edge tabs 14, 16 when the circuit card is inserted into the rack. Frame members 54 and 56 have fluid passages 60 and 62 respectively through which a gaseous or liquid coolant is circulated such that the frame members serve as a heat sink or heat exchanger to dissipate heat in operation from the circuit cards in the rack. Circuit cards such as the ISEM-2A Module type are referred to as conduction modules because the metallic bodies thereof transfer heat generated in operation by the electronic components mounted thereon by conduction through the body of the card and into the frame of the rack for dissipation into the coolant circulating through the heat exchange passages.

In operation, the circuit card 10 of the invention is installed in a rack 52 by sliding the edge tabs 14, 16 into the guide rails 58 on the upper and lower frame 54 and 56 respectively and the necessary electrical connections are made. When the equipment in which the circuit card is a part is operated and electrical current flows through the components mounted on the card, heat is generated thereby. This heat is dissipated into the body 12 of the card, from whence it flows by conductance to the evaporator section of the heat pipe on side 22 of the card. The heat input vaporizes the liquid in the wick 42 (and capillary grooves 43) in the evaporator section of the heat pipe and the vapor moves along the vapor space 40 to the relatively cool condenser sections of the heat pipe on ends 20 and 24 of the card. Heat from the condenser sections is conducted through edge tabs 14, 16 and through rack frame members 54, 56 and passes into the coolant circulating in passages 60, 62 for transfer to a heat sink (not shown) associated therewith. The liquid condensed in the condenser sections of the heat pipe saturates the wick 42 (and capillary grooves 43) and is moved by capillary action back to the evaporator section where the cycle is repeated. Because the latent heat of vaporization of the liquid is carried by vapor from the region of evaporation to the region of condensation, heat is transferred down the pipe with little or no temperature drop along the length of the heat pipe.

Incorporation of the heat pipe thus enables the circuit card of the invention to handle substantially twice the circuit card power on the card with the same electronic component layout and spacing as a standard conduction-type card or module (see FIG. 5). Because of the improved heat dissipation of the card of this invention, the operating temperatures of the electronic components mounted thereon are reduced in comparison with that of components on pure conduction cards (see FIG. 6) which results in more efficient operation and an increase in the mean time between failures of the components. About the same power load can be handled by the inventive circuit card as modules using air-over-components techniques. However, because there is no limitation because of fan capacity, more of the inventive circuit cards can be packed into a rack, yielding systems with a higher power density. As stated previously, the inventive circuit card and the standard ISEM-2A Modules are interchangeable, thus a more efficient utilization of the two types is possible. The inventive circuit card can be used where high heat dissipation is required, and the less expensive standard card can be used where the heat dissipation requirements are not as onerous. Both the inventive and the standard circuit cards can use the same electronic component mounting techniques such that no special skills, tools, or equipment is required to take advantage of the card interchangeability.

Although shown and described in what is believed to be the most practical and preferred embodiment, it is apparent that departures from the specific method and design described will suggest themselves to those skilled in the art and may be made without departing from the spirit and scope of the invention. We, therefore, do not wish to restrict ourselves to the particular construction illustrated and described, but desire to avail ourselves of all modifications that may fall within the scope of the appended claims.

Having thus described our invention, what we claim is:

1. An electronic component mounting module for use in a rack associated with electronic systems, said rack having frame members provided with guide rails receiving said electronic module, said frame members having cooling means therein, the improvement comprising:

an elongated metallic circuit card having first and second longitudinal sides and first and second ends, said circuit card having a solid substantially planar thermally conductive body mounting a plurality of electronic components on the opposite surfaces thereof;

a heat pipe integral with and in thermal contact with said body and extending along the edge of said first longitudinal side and said first and second ends, said heat pipe having a hermetically sealed casing having an uninterrupted vapor flow passage extending the full extent of said heat pipe, said casing being evacuated of air, capillary pumping means in said casing, and in a working fluid contained in a liquid state in said capillary pumping means and a vapor state in said flow passage for the transfer of heat;

an electrical connector extending along said second longitudinal side of said card and establishing electrical communication with said electronic components mounted on said card;

elongated coplanar upstanding tabs on said heat pipe and extending from said heat pipe at said ends of said card, said tabs fitting into said guide rails in said frame members in said rack such that said card is installed in said rack for operation therein, wherein the longitudinal section of said heat pipe serves as the evaporator region and the end sections serve as the condenser regions whereby the heat generated by the operation of said electronic components is conducted through said card body and passes into said heat pipe longitudinal section, evaporating said liquid in said capillary means, the vapor therefrom transferring said heat to the condenser section of said heat pipe where said heat is conducted through said tabs for dissipation therefrom.

* * * * *